US012772628B2

(12) United States Patent
Krames et al.

(10) Patent No.: US 12,772,628 B2
(45) Date of Patent: Oct. 20, 2026

(54) LED ARRAY FOR IN-PLANE OPTICAL INTERCONNECTS

(71) Applicant: AVICENATECH CORP., Sunnyvale, CA (US)

(72) Inventors: Michael Krames, Austin, TX (US); Bardia Pezeshki, Sunnyvale, CA (US); Robert Kalman, Sunnyvale, CA (US); Cameron Danesh, Sunnyvale, CA (US)

(73) Assignee: AvicenaTech, Corp., Sunnyvale, CA (US)

( * ) Notice: Subject to any disclaimer, the term of this patent is extended or adjusted under 35 U.S.C. 154(b) by 0 days.

(21) Appl. No.: 18/108,574

(22) Filed: Feb. 10, 2023

(65) Prior Publication Data

US 2023/0197695 A1 Jun. 22, 2023

Related U.S. Application Data

(62) Division of application No. 17/204,687, filed on Mar. 17, 2021, now Pat. No. 11,605,618.

(Continued)

(51) Int. Cl.

| | |
|---|---|
| *H10H 20/855* | (2025.01) |
| *H10H 20/812* | (2025.01) |
| *H10H 20/814* | (2025.01) |
| *H10H 20/82* | (2025.01) |
| *H10H 20/825* | (2025.01) |

(Continued)

(52) U.S. Cl.

CPC ........ *H10H 20/855* (2025.01); *H10H 20/812* (2025.01); *H10H 20/814* (2025.01); *H10H 20/82* (2025.01); *H10H 20/825* (2025.01); *H10H 20/856* (2025.01); *H10H 20/857* (2025.01); *H10W 90/00* (2026.01)

(58) Field of Classification Search

None

See application file for complete search history.

(56) References Cited

U.S. PATENT DOCUMENTS

| | | | |
|---|---|---|---|
| 5,335,361 | A | 8/1994 | Ghaem |
| 5,638,469 | A | 6/1997 | Feldman |

(Continued)

FOREIGN PATENT DOCUMENTS

| | | | |
|---|---|---|---|
| CN | 104885235 | A | 9/2015 |
| CN | 110797330 | A | 2/2020 |

(Continued)

OTHER PUBLICATIONS

Lars Brusberg et al., Optoelectronic Glass Substrate for Co-Packaged Optics and ASICs, Optical Fiber Communication Conference, Mar. 12, 2020, San Diego, CA, pp. 1-24.

(Continued)

*Primary Examiner* — Feifei Yeung Lopez

(57) ABSTRACT

An LED array on a sapphire substrate may be mounted on a silicon interconnect chip, with LEDs of the array inserted into holes of waveguides on the silicon interconnect chip. The sapphire substrate and the silicon interconnect chip may both have microbumps for carrying electrical signals to or from the LEDs, and the sapphire substrate and silicon interconnect chip may be bonded together using the microbumps. The LEDs may be configured to preferentially emit light in a lateral direction, for increased coupling of light into the waveguides.

4 Claims, 6 Drawing Sheets

Related U.S. Application Data

(60) Provisional application No. 62/991,463, filed on Mar. 18, 2020.

(51) Int. Cl.

| | |
|---|---|
| ***H10H 20/856*** | (2025.01) |
| ***H10H 20/857*** | (2025.01) |
| ***H10W 90/00*** | (2026.01) |

(56) References Cited

U.S. PATENT DOCUMENTS

| | | | | |
|---|---|---|---|---|
| 5,848,214 | A | 12/1998 | Haas | |
| 6,242,761 | B1 * | 6/2001 | Fujimoto | H01L 33/145 257/618 |
| 7,459,726 | B2 | 12/2008 | Kato | |
| 7,915,699 | B2 | 3/2011 | Krishnamoorthy | |
| 8,148,202 | B2 | 4/2012 | Krishnamoorthy | |
| 2002/0190260 | A1 * | 12/2002 | Shen | H10H 20/857 257/E33.059 |
| 2004/0119077 | A1 * | 6/2004 | Misra | H10H 20/814 257/E33.068 |
| 2004/0159777 | A1 | 8/2004 | Stone | |
| 2004/0208416 | A1 | 10/2004 | Chakravorty | |
| 2005/0123016 | A1 | 6/2005 | Behfar | |
| 2005/0194605 | A1 | 9/2005 | Shelton | |
| 2007/0085105 | A1 * | 4/2007 | Beeson | G02B 19/0071 257/E33.072 |
| 2010/0265694 | A1 | 10/2010 | Kim | |
| 2011/0051043 | A1 * | 3/2011 | Kim | H01L 25/0753 349/64 |
| 2011/0175117 | A1 * | 7/2011 | Jagt | H01L 33/46 257/E33.061 |
| 2012/0086028 | A1 | 4/2012 | Beeson | |
| 2013/0258663 | A1 | 10/2013 | Woodgate | |
| 2016/0020353 | A1 | 1/2016 | Chu | |
| 2016/0172020 | A1 | 6/2016 | Baker | |
| 2016/0233269 | A1 | 8/2016 | Choi | |
| 2016/0327743 | A1 | 11/2016 | Kippenberg | |
| 2017/0276874 | A1 | 9/2017 | Kashyap | |
| 2019/0049367 | A1 | 2/2019 | Zou | |
| 2019/0088633 | A1 | 3/2019 | Tao | |
| 2019/0094642 | A1 * | 3/2019 | Saenger Nayver | G02F 1/157 |
| 2019/0189603 | A1 | 6/2019 | Wang | |

FOREIGN PATENT DOCUMENTS

| | | |
|---|---|---|
| JP | 2011014932 A | 1/2011 |
| WO | WO 2020/025055 | 2/2020 |

OTHER PUBLICATIONS

J. F. C. Carreira et al., Direct Integration of Micro-LEDs and a SPAD Detector on a Silicon CMOS Chip for Data Communications and Time-of-Flight Ranging, Optics Express, vol. 28, No. 5, Mar. 2, 2020, pp. 6909-6917.

Brian Corbett et al., Chapter Three—Transfer Printing for Silicon Photonics, Semiconductors and Semimetals, vol. 99, 2018, ISSN 0080-8784, pp. 43-70, https://doi.org/10.1016/bs.semsem.2018.08.001.

Roger Dangel et al., Polymer Waveguides Enabling Scalable Low-Loss Adiabatic Optical Coupling for Silicon Photonics, IEEE Journal of Selected Topics In Quantum Electronics, vol. 24, No. 4, Jul./Aug. 2018, 11 pages.

Martin D. Dawson, Micro-LEDs for Technological Convergence between Displays, Optical Communications, & Sensing and Imaging Systems, SID Display Week 2020, Session 44, Invited paper No. 44.1, 27 pages.

David A. B. Miller, Optical Interconnects, IAA Workshop, Jul. 22, 2008, pp. 1-26.

Lei Liu et al., On-Chip Optical Interconnect on Silicon by Transfer Printing, In: CLEO: Science and Innovations 2018, San Jose, California, USA, May 13-18, 2018, pp. 1-2.

Shen, Y.C. et al., Optical Cavity Effects in InGaN/GaN Quantum-Well-Heterostructure Flip-Chip Light-Emitting Diodes, Applied Physics Letters, vol. 82, No. 14, Apr. 7, 2003, pp. 2221-2224.

Bing Wang et al., On-chip Optical Interconnects using InGaN Light-Emitting Diodes Integrated with Si-CMOS, In: Aais Communications and Photonics Conference 2014, Shanghai, China, Nov. 11-14, 2014, pp. 1-3.

Yurii Vlasov, Silicon Photonics for Next Generation Computing Systems, Tutorial given at the European Conference on Optical Communications, Sep. 22, 2008.

Ziyang Zhang et al., Hybrid Photonic Integration on a Polymer Platform, Photonics 2015, 2, pp. 1005-1026.

International Search Report on related PCT Application No. PCT/US2021/022817 from International Searching Authority (KIPO) dated Jul. 12, 2021.

Written Opinion on related PCT Application No. PCT/US2021/022817 from International Searching Authority (KIPO) dated Jul. 12, 2021.

Extended European Search Report in related European Application No. 21771597.8 dated Jun. 4, 2024.

Delbeke D. et al., "High-Efficiency Semiconductor Resonant-Cavity light-Emitting Diodes: A Review", IEEE Journal of Selected Topics in Quantum Electronics, IEEE, USA, vol. 8, No. 2, Mar. 31, 2002, pp. 189-206.

Office Action issued by China National Intellectual Property Administration (CNIPA) in related Chinese Application No. 202180025849.2, dated Jul. 26, 2025.

* cited by examiner

LED ARRAY FOR IN-PLANE OPTICAL INTERCONNECTS

CROSS REFERENCE TO RELATED APPLICATION

This application is a divisional of U.S. patent application Ser. No. 17/204,687, filed on Mar. 17, 2021, which claims the benefit of the filing date of U.S. Provisional Patent Application No. 62/991,463, filed on Mar. 18, 2020, the disclosures of each of which is incorporated by reference herein.

BACKGROUND OF THE INVENTION

Optical interconnects are interesting for high-speed computing. In particular, the use of very small (e.g., micron-scale) LEDs, or "microLEDs," as data transmitters is especially interesting due to the potential bandwidth increase for optical data traffic between electronic chips by exploiting a very large number of optical interconnects in a reasonably sized form factor. Challenges in this approach may include manufacturing-friendly solutions for fabricating the microLEDs as well as efficient coupling of light from the microLEDs into the optical interconnect platform.

BRIEF SUMMARY OF THE INVENTION

Some embodiments provide a light emitting device, comprising: a waveguide; a light emitting diode comprising: a Gallium nitride (GaN) n-type layer, a GaN p-type layer, a (GaN) active layer, between the n-type layer and the p-type layer, comprising at least one quantum well layer containing In, a reflective layer proximal to the p-type layer, wherein the distance between the at least one quantum well and the reflective layer is chosen so that light generated from the active layer is preferentially emitted into lateral modes in a direction away from the surface normal to the active layer; wherein the waveguide and active layer are positioned to allow for light emitted from the active layer to be efficiently coupled into the waveguide. In some such embodiments the chosen distance between the at least one quantum well and the reflective layer is dependent on a phase shift with respect to light reflected by the reflective layer. In some such embodiments the reflective layer is metal. In some such embodiments the reflective layer is a p-side contact for the p-type layer. In some such embodiments the distance between the at least one quantum well and the reflective layer is selected such that a majority of the light generated from the active layer is coupled into the waveguide. In some embodiments the reflective layer is selected such that more than 85% of the light generated from the active layer is coupled into the waveguide. In some embodiments, the fraction of light coupled into the waveguide is at least 70%, more preferably 80% or more, of the light generated from the active layer.

Some embodiments provide a microLED array chip bonded to a silicon interconnect chip, comprising: a first substrate; a plurality of microLEDs on a first surface of the substrate; a plurality of first microbump metallizations on the first surface of the substrate; a silicon wafer; a plurality of waveguides on the silicon wafer, the waveguides including holes at least partially receiving the microLEDs; a plurality of second microbump metallizations on the silicon wafer, the second microbump metallizations bonded to the first microbump metallizations by solder microbumps. In some such embodiments the microLEDs each comprise: an n-type GaN layer; a p-type GaN layer; an active layer including at least one quantum well (QW) between the n-type layer and the p-type layer; and a contact metallization on the p-type layer; with a distance between the active layer and the contact metallization on the p-type layer being a distance such that light within the LED is preferentially emitted toward side edges of the LED. In some such embodiments the waveguides comprise silicon nitride waveguides. Some such embodiments further comprise reflective metallization capping an end of the waveguides.

These and other aspects of the invention are more fully comprehended upon review of this disclosure.

DETAILED DESCRIPTION

In some embodiments a microLED array chip includes a plurality of microLEDs. The microLEDs are adjacent to or within cavities of waveguides. The waveguides may be wholly or partially on or over (or under) a substrate. In some embodiments, the substrate may be an interposer for semiconductor chips, a package substrate, a silicon-based interconnect chip, or a semiconductor chip including logic circuitry or related circuitry, in various embodiments. The microLEDs may be driven by electrical signals from a semiconductor chip. In various embodiments the waveguides are for optically coupling the microLEDs to optically sensitive receiving components, for example photodetectors, which may be photodiodes. The photodetectors are generally coupled to electrical circuitry for providing electrical signals to another or the same semiconductor chip. Together, the microLEDs and photodetectors may be used in the provision of optical chip-to-chip data communication for a multi-chip module, for example between chips within the multi-chip module or between chips in different multi-chip modules, or intra-chip data communications.

Figure 1:
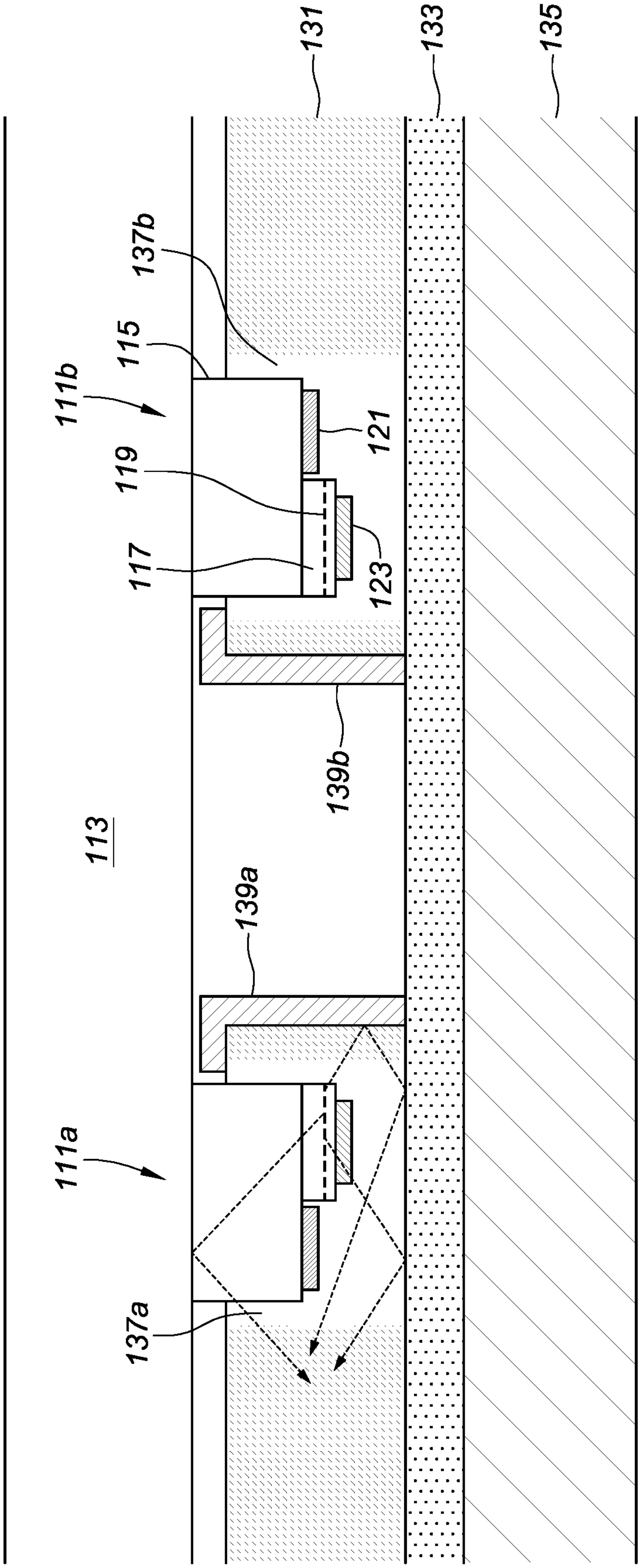
FIG. 1 is a cross-section view of portions of a microLED array chip coupled to a silicon-based interconnect chip, in accordance with aspects of the invention.

A cross-section view of portions of a microLED array chip coupled to a silicon-based interconnect chip is shown in FIG. 1. The microLED array chip includes a plurality of microLEDs 111*a,b* (with two shown in FIG. 1) formed on a substrate, for example a sapphire substrate 113 as illustrated in FIG. 1. The microLEDs are shown as generally extending from the sapphire substrate 113 into holes in or cavities 137*a,b* of optical waveguides 131. The waveguides may be on a substrate, for example a silicon substrate, or as shown in FIG. 1, a silicon oxide layer 133 on a silicon wafer 135.

The microLED array may be fabricated using conventional processes known for InGaN/GaN based LEDs on a sapphire substrate. Using MOCVD or other epitaxial growth techniques, GaN buffer layers are deposited on a sapphire substrate, followed at least by an n-type (e.g., Si doped) GaN layer, InGaN-based active layers (e.g., InGaN quantum wells separated by GaN barrier layers), and a p-type (e.g., Mg doped) GaN layer 117. After growth, the wafer is annealed at high temperature in order to drive off hydrogen and activate the GaN:Mg layer(s). P-type Ohmic contact metallization 123 is deposited and patterned by standard techniques. One preferred metal is Ag-based such as NiAg or pure Ag. (Optional encapsulation metallization, overlying and encasing the p-type metallization, may be optionally employed, for example to mitigate electro-migration, especially in the case of Ag.) A "p-mesa" 119 is formed by patterning the wafer and etching the structure (e.g., using RIE or ICP etching) to expose the n-type GaN layer(s) 115. N-type Ohmic contact metallization 121 is then deposited and patterned by standard techniques on the exposed n-layer. Next, an "n-mesa" 115 is formed by patterning around the p and n contacts and etching down to, or near to, or into, the sapphire substrate. Then, the sapphire substrate may be ground and polished and individual LED array chips may be diced from the thinned sapphire substrate using processes known in the art, such as laser-based scribe-and-break. The individual LED array chips may hold very many microLEDs in a wide variety of layouts.

Typical sizes, for example in terms of width, for the p-mesas per side are less than 10 um, preferably less than 5 um, and more preferably less than 3 um. Typical sizes, for example in terms of width, for the n-mesas per side are less than 20 um, preferably less than 10 um, and more preferably less than 5 um. Electrical interconnect traces are deposited to electrically connect to the p and n Ohmic contacts of the various LEDs and route them out to microbumps deposited on the sapphire surface, and passivation dielectric(s) can be used to electrically isolate the interconnects from parts of the LED structure as required (not shown in FIG. 1). The LED array chip dimensions can be several 10's of um even up to 1 mm or more, for example on a side, allowing it to be handled with existing pick-and-place tools.

The silicon interconnect chip comprises a silicon wafer 135 with an oxide layer 133 formed thereon, followed by the deposition and patterning of optical waveguide layers 131 on the oxide layer. Typical materials for the waveguide layers are SiNx, for example. In patterning the waveguide layers, insertion holes 137*a,b* are provided or formed such that the mesas containing the LEDs chip can be inserted into the insertion holes, effectively inserting the active layers of the microLEDs inside the waveguides in some embodiments.

Figure 2:
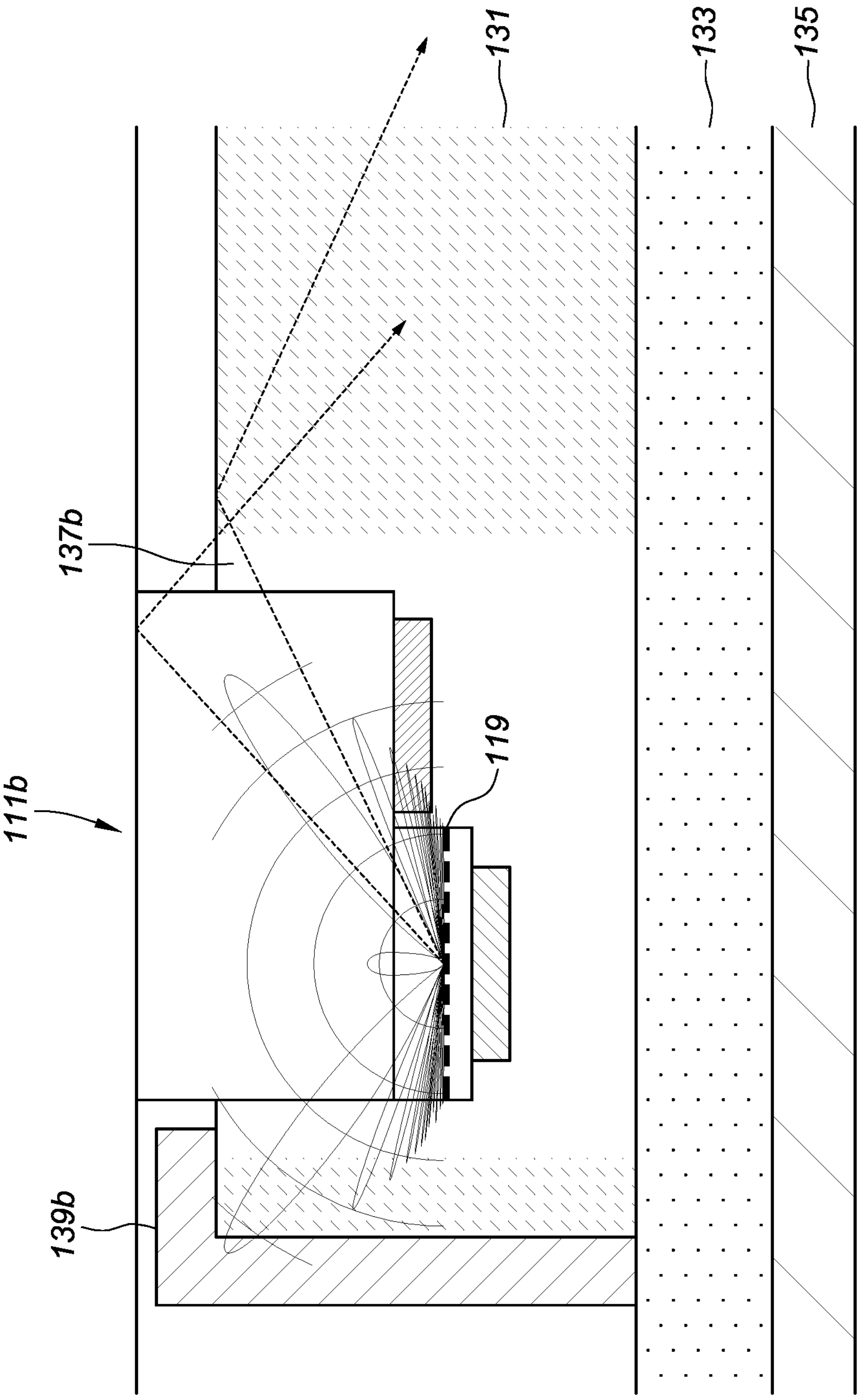
FIG. 2 illustrates a portion of the microLED array chip coupled to the silicon-based interconnect chip of FIG. 1 about a one of the LEDs, along with an example dipole radiation pattern for light emitted by the LED.

In operation, the LED array chip is activated such that light from the active layers 119 (the extent of which may be defined by the p-mesa area) may couple into the waveguides on the Si interconnect chip. Normally, one might expect the amount of coupling to be very low, due to significant light from the active layers out-coupling into the sapphire substrate, resulting in loss. In some embodiments a dipole radiation pattern of the LED active layer is modified by exploiting optical cavity effects, for example interference effects, especially in the case of quantum well (QWs) devices and by employing a highly reflective contact (e.g., p contact) in close proximity to the QWs, such that light emission is predominantly coupled into lateral modes, so that reduced amounts or very little light escapes into the sapphire substrate. In some embodiments this is accomplished by controlling the total thickness of the epitaxial layers above the QWs, and the effectiveness is increased by employing a highly reflective p-side contact, such as Ag-based contacts. In this embodiment with the proper cavity tuning, light is may be considered guided, preferentially emitted from, the GaN epitaxial layers toward the LED mesa edges, and is allowed to couple into the waveguide at angles within their numerical aperture (NA) (of the waveguide), resulting in highly efficient coupling of light from the LED active layers to the waveguide. For example, FIG. 2 illustrates a portion of the device of FIG. 1 about one of the LEDs 111*b*, along with an example dipole radiation pattern for light emitted from a portion of the LED near the active region 119. In FIG. 2, the dipole radiation pattern 211 is generally directed somewhat laterally with respect to the normal of the substrate 133, 135 on which the waveguide reposes, such that light may be preferentially guided or emitted towards and into the waveguide. In order to direct light in one direction of the waveguide, one end of the waveguide may be capped by a reflective metallization 139*a,b* (for example processed onto the Si interconnect chip), for example as illustrated in both FIG. 1 and FIG. 2.

Figure 6:
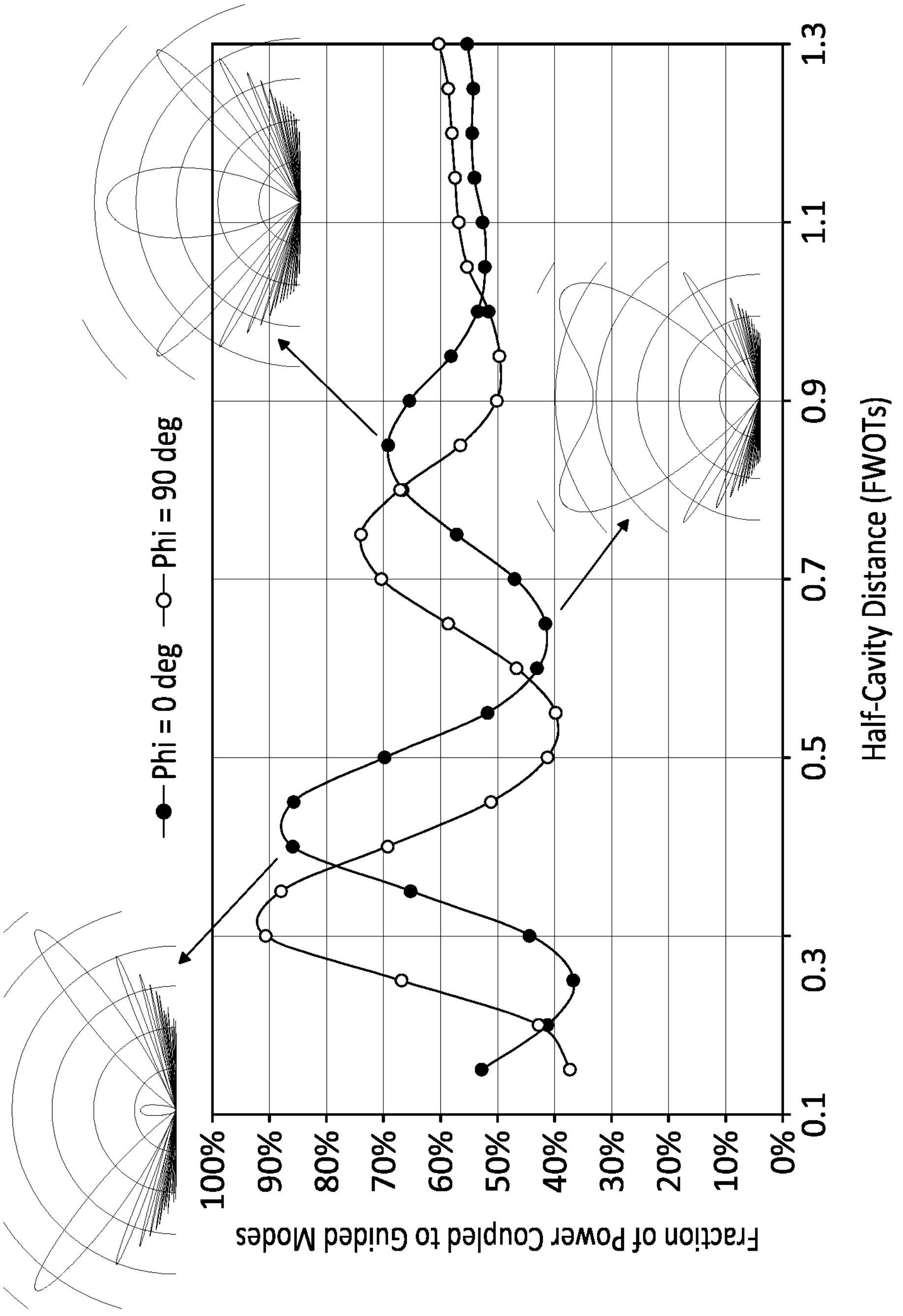
FIG. 6 is a graph showing fraction of light coupled into guided modes against QW to reflector distance.

Detailed calculations for some such embodiments are summarized in FIG. 6. FIG. 6 is a graph showing fraction of light coupled into lateral modes against QW-to-reflector distance. Assuming a single-QW active region and a metal contact to the p-side surface with reflectivity of 90%, the fraction of light coupled into lateral modes (that can be coupled into a waveguide rather than being lost into the sapphire substrate) is calculated. This quantity is plotted as a function of the distance between the QW and the reflector (i.e., half-cavity distance, d) in terms of full wave optical thicknesses (FWOTs), for two different cases of phase shifts, 0 and 90 degrees, with respect to an infinitely conductive metal reflector. QW radiation patterns are shown in the insets of FIG. 6, for the cases of d=0.4, 0.65, and 0.85 FWOT with 0 degree phase shift.

The lateral mode emission from a GaN LED is entitled to be coupled efficiently into an optical waveguide. The critical angle for total internal reflection (TIR) at the GaN/sapphire (n=2.4, 1.77, respectively) interface in the blue is ~arcsin (1.77/2.4)=47.5 deg relative to the surface normal. Assuming a silicon nitride (SiN) optical waveguide with n=2.3, on top of silicon oxide (n~1.47), the critical angle is ~arcsin (1.47/2.3)=39.7 deg relative to the surface normal. LED emission into the range of angles that experience TIR is efficiently coupled to guided waveguide modes. Detailed calculations show that, for an LED with optimally tuned cavity, a very large fraction of emitted light (for example up to more than 85%) can be coupled to these waveguide modes.

Figure 3:
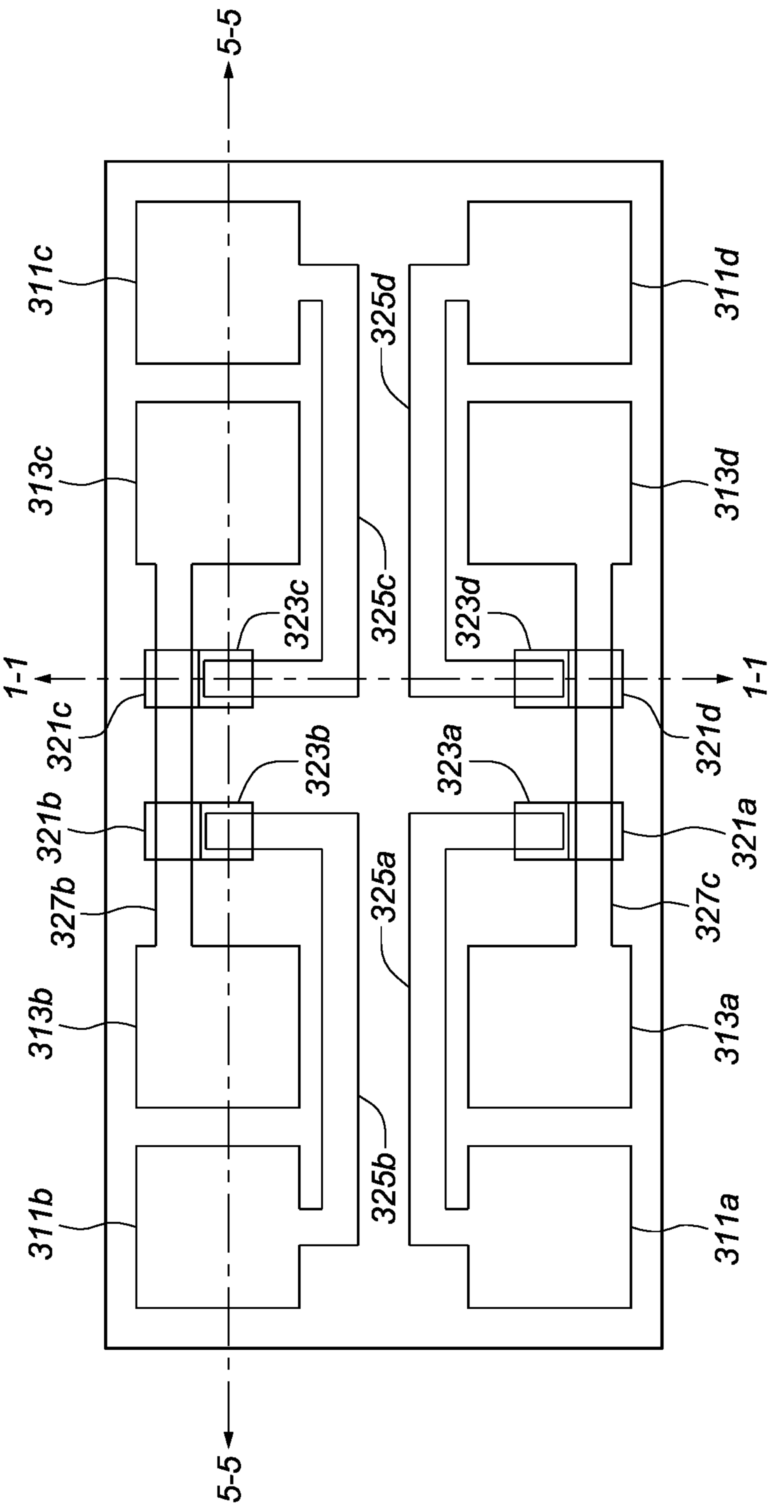
FIG. 3 is a plan view of an embodiment of an LED array in accordance with aspects of the invention.
Figure 5:
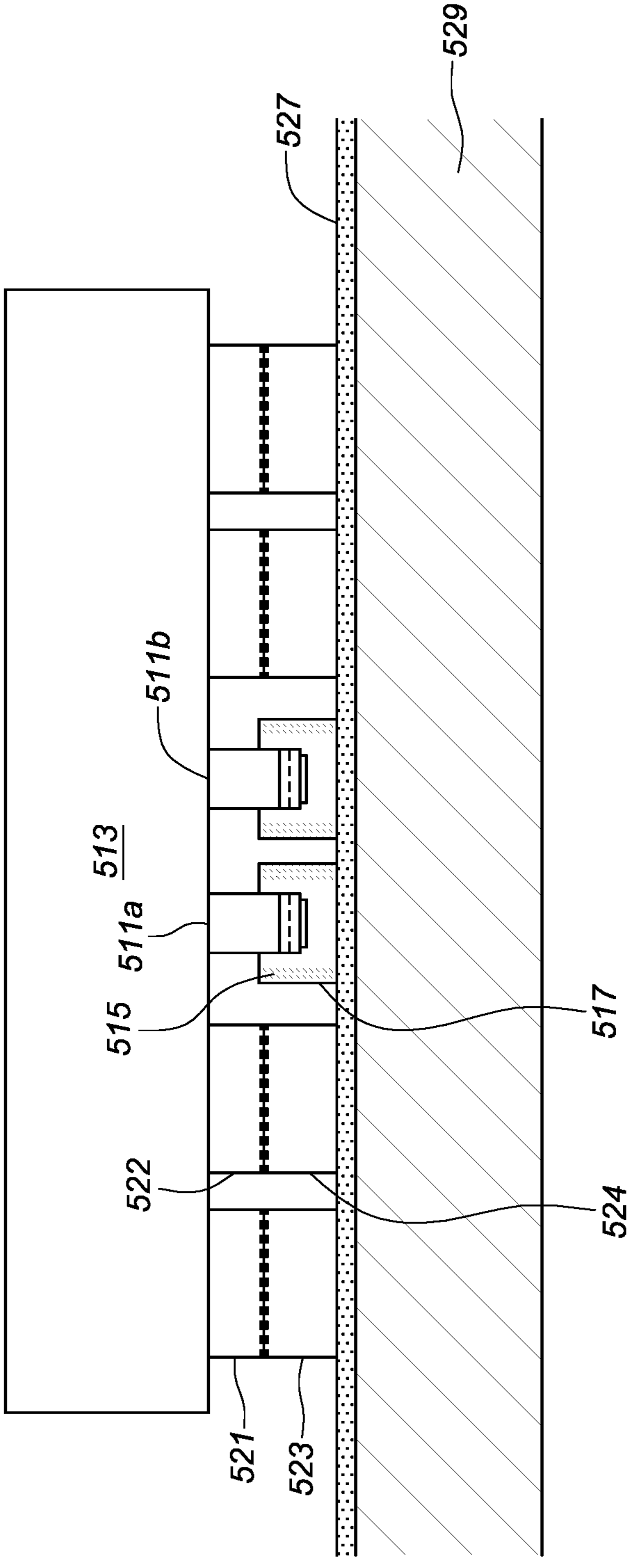
FIG. 5 is a cross-section view of an microLED array chip bonded to a silicon interconnect chip, in accordance with aspects of the invention.

An LED array embodiment (with four microLEDs) is shown in plan view in FIG. 3. The LED array may be of the LED array chip of FIG. 1, in some embodiments. The LED Ohmic p-contacts 323*a-d* are electrically connected to metal interconnects 325*a-d* which route out on top of the sapphire substrate to microbump metallizations 311*a-d* for (eventually) electrically interconnecting the LED array chip to the Si interconnect chip. Similarly, the LED Ohmic n-contacts 321*a-d* are electrically connected to metal interconnects 327*a,b* which route out on top of the sapphire substrate to microbump metallizations 313*a-d* for (eventually) electrically interconnecting the LED array chip to the Si interconnect chip. In the embodiment of FIG. 3, the microbump metallizations 313*a-d*, in pairs, share a common metal interconnect. A common cathode configuration is shown in FIG. 3, but alternative electrical configurations are possible and within the scope of the invention. The microbumps may be, for example, generally as illustrated in FIG. 5. FIG. 5 is a cross-section view of an microLED array chip bonded to a silicon interconnect chip, in accordance with aspects of the invention. FIG. 5 shows LEDs 511*a,b* mounted on a sapphire substrate 513. Each LED extends into a waveguide, with for example LED 511*a* extending into a waveguide 515. The waveguides are on a silicon wafer 529, which has a top surface with a layer of silicon oxide 527. Microbumps couple the silicon wafer and the sapphire substrate. The sapphire substrate has microbumps extending in the same direction as the LEDs, with for example a microbump metallization 521 for an LED drive signal and a microbump metallization 522 for a common signal. Similarly, the silicon wafer has microbumps positioned so as to be able to be bonded to the microbumps of the sapphire substrate, with for example a microbump metallization 523 bonded to the microbump 521 and a microbump metallization 524 bonded to the microbump 522.

Figure 4:
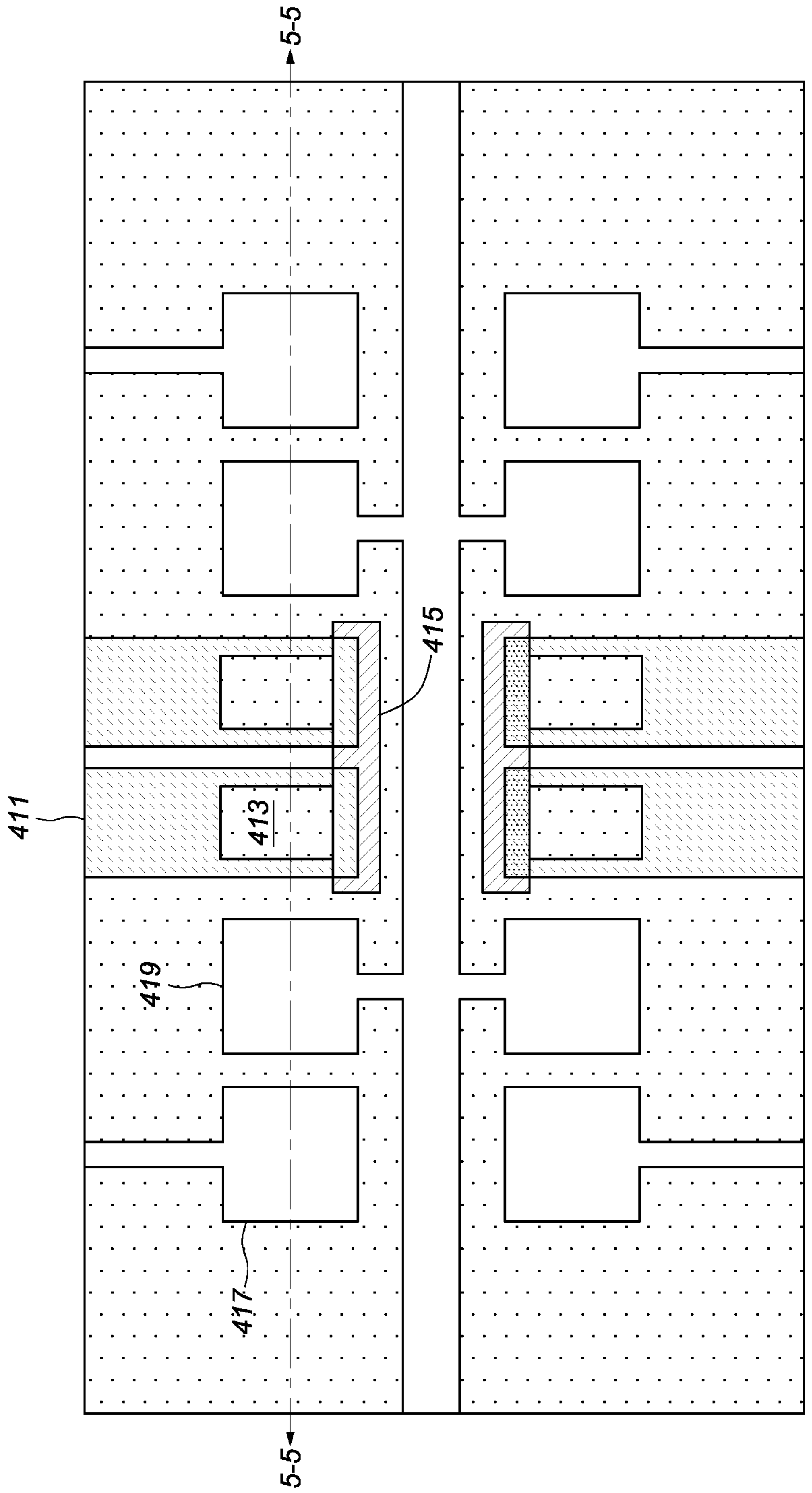
FIG. 4 is a plan view of an embodiment of a silicon interconnect chip, in accordance with aspects of the invention.

A portion of an embodiment of the Si interconnect chip is shown in plan view in FIG. 4. FIG. 4 shows microbump metallizations 417 for LED drive signals and microbump metallizations 419 for common signals on a silicon substrate. Waveguides 411 are on the silicon substrate, with the waveguides including holes 413 for insertion of the LEDs. Reflective metallization 415 is about rear ends of the waveguides and holes, for reflecting light from the LEDs into the waveguides. Typical sizes for the waveguide heights and widths are less than 10 um, preferably less than 5 um, and more preferably less than 3 um. Typical sizes for the microbump widths are less than 15 um, preferably less than 10 um, and more preferably less than 5 um.

In assembly, the LED array chip is bonded to the Si interconnect chip via pick-and-place and a bonding process appropriate for the choice of microbump metallization(s). The assembly, LED array chip bonded to the Si interconnect chip, is shown in FIG. 5. Microbump metallizations on the sapphire and Si chips are designed and constructed so that the microLEDs on the sapphire chip insert into the holes in the waveguides to the appropriate depth so as to ensure sufficient light coupling into the waveguides.

In some embodiments standard fabrication techniques are employed for the InGaN/GaN LEDs, including use of conventional (non-patterned) sapphire substrates and without requiring complicated substrate removal (e.g., laser lift-off) techniques. In some embodiments microLED emitters are provided using standard die-attach techniques. In some embodiments light coupling from the LED into the waveguides on the Si interconnect chip is very efficient. In some embodiments an LED chip encapsulant (e.g., silicone) is included in the hole between the LED chip and the waveguide to further increasing light coupling. In some embodiments the Si interconnect chip contains all the electrical and optical routing and can also contain driver circuitry to operate the microLEDs.

Although the invention has been discussed with respect to various embodiments, it should be recognized that the invention comprises the novel and non-obvious claims supported by this disclosure.

What is claimed is:

1. A light emitting device, comprising:

a silicon nitride (SiN) waveguide having an insertion hole about a longitudinal end of the waveguide, with a reflective metallization capping the longitudinal end of the waveguide;

a light emitting diode, on a first substrate, comprising:

a Gallium nitride (GaN) n-type layer, a GaN p-type layer, a GaN active layer, between the GaN n-type layer and the GaN p-type layer, comprising at least one quantum well layer containing In, a reflective layer on the GaN p-type layer, the reflective layer being more distal from the first substrate than the GaN p-type layer, wherein the distance in terms of full wave optical thickness (FWOT) between the at least one quantum well layer and the reflective layer is chosen so that light generated from the GaN active layer is preferentially emitted into lateral modes away from a surface normal to the GaN active layer, with the distance in terms of FWOT being about 0.4;

wherein the GaN active layer is positioned within the insertion hole of the waveguide to allow for light from the GaN active layer to be efficiently coupled into the waveguide;

wherein the reflective layer is a metal; and wherein the reflective layer is a p-side contact for the GaN p-type layer.

2. The light emitting device of claim 1, wherein the reflective layer is parallel to the GaN active layer.

3. The light emitting device of claim 1, wherein the chosen distance between the at least one quantum well layer and the reflective layer is dependent on a phase shift with respect to light reflected by the reflective layer.

4. The light emitting device of claim 3, wherein the waveguide is on a second substrate.

* * * * *